US006976234B2

(12) United States Patent
Kasapi

(10) Patent No.: US 6,976,234 B2
(45) Date of Patent: Dec. 13, 2005

(54) APPARATUS AND METHOD FOR MEASURING CHARACTERISTICS OF DYNAMIC ELECTRICAL SIGNALS IN INTEGRATED CIRCUITS

(75) Inventor: Steven Kasapi, San Francisco, CA (US)

(73) Assignee: Credence Systems Corporation, Milpitas, CA (US)

( * ) Notice: Subject to any disclaimer, the term of this patent is extended or adjusted under 35 U.S.C. 154(b) by 89 days.

(21) Appl. No.: 10/341,721

(22) Filed: Jan. 13, 2003

(65) Prior Publication Data

US 2004/0139406 A1 Jul. 15, 2004

(51) Int. Cl.[7] ............................................. G06F 17/50
(52) U.S. Cl. .................................. 716/6; 716/1; 716/19
(58) Field of Search ............................. 716/1, 6, 19, 4, 716/5; 374/17; 250/574; 600/346

(56) References Cited

U.S. PATENT DOCUMENTS

| | | | |
|---|---|---|---|
| 4,681,449 A | | 7/1987 | Bloom et al. |
| 4,758,092 A | | 7/1988 | Heinrich et al. |
| 5,497,009 A | * | 3/1996 | Torikoshi et al. ........... 250/574 |
| 5,508,610 A | | 4/1996 | Feeney |
| 5,631,571 A | | 5/1997 | Spaziani |
| 5,640,539 A | | 6/1997 | Goishi et al. |
| 5,663,967 A | | 9/1997 | Prasad et al. |
| 5,682,888 A | * | 11/1997 | Olson et al. ................ 600/436 |
| 5,683,179 A | * | 11/1997 | Lowry ......................... 374/17 |
| 5,721,688 A | | 2/1998 | Bramwell |
| 5,872,360 A | | 2/1999 | Paniccia et al. |
| 5,905,577 A | | 5/1999 | Wilsher et al. |
| 5,940,545 A | | 8/1999 | Kash et al. |
| 5,949,900 A | | 9/1999 | Nakamura et al. |
| 6,107,107 A | | 8/2000 | Bruce et al. |
| 6,184,696 B1 | | 2/2001 | White |
| 6,331,782 B1 | | 12/2001 | White |
| 6,621,275 B2 | | 9/2003 | Cotton |
| 6,686,755 B2 | | 2/2004 | White |
| 6,859,031 B2 | | 2/2005 | |

FOREIGN PATENT DOCUMENTS

JP        407320173 A    12/1995

OTHER PUBLICATIONS

K. Soumyanath et al., "Accurate On–Chip Interconnect Evaluation: A Time–Domain Technique," IEEE Journal of Pakdaman et al. Solid–State Circuits, vol. 34, No. 5, May 1999, pp 623–631.

Stefan Rusu et al., "Backside Infrared Probing for Static Voltage Drop and Dynamic Timing Measurements," 2001 IEEE International Solid–State Circuit Conference, Feb. 7, 2002. Digest of Technical Papers. ISSCC. 2001 IEEE International, pp 276–277, 454.

J.A. Kash, J.C. Tsang, "Dynamic Internal Testing of CMOS Circuits Using Hot Luminescence" IEEE Electron Device Letters, vol. 18, No. 7, p. 330–332, Jul. 1997.

Ali Muhtaroglu, et al. "On–Die Droop Detector for Analog Sensing of Power Supply Noise" IEEE Journal of Solid–State Circuits, vol. 39 No. 4, Apr 2004, p. 651–660.

* cited by examiner

*Primary Examiner*—Thuan Do
(74) *Attorney, Agent, or Firm*—Sughrue Mion, PLLC

(57) ABSTRACT

Systems and methods consistent with principles of the present invention allow contactless measurements of voltage characteristics of dynamic electrical signals in integrated circuits. The invention utilizes a signal analysis circuit, such as a voltage comparator, disposed with the circuit under test, which is optically coupled with the external timing measurement equipment. The signal analysis circuit changes its state depending on the characteristics of the measured electrical signal applied thereto. The changes in the condition of the signal analysis circuit are sensed by the external timing measurement equipment provided outside the circuit under test. To this end, the signal analysis circuit is optically coupled with the external measurement equipment registering specific changes in the condition of the signal analysis circuit. The information on the condition of the signal analysis circuit registered by the external measurement equipment is used to study the characteristics of the dynamic electrical signals within the circuit.

38 Claims, 5 Drawing Sheets

APPARATUS AND METHOD FOR MEASURING CHARACTERISTICS OF DYNAMIC ELECTRICAL SIGNALS IN INTEGRATED CIRCUITS

DESCRIPTION OF THE INVENTION

1. Field of the Invention

The present invention generally relates to performing measurements on integrated circuits, and more specifically to performing measurements of voltage characteristics of dynamic electrical signals in integrated circuits.

2. Description of the Related Art

Testing of integrated circuits often requires performing dynamic measurements of voltage signals at various points within the circuit. For example, in a semiconductor memory cell, the stored logic values of "0" and "1" are differentiated between one another in accordance with a voltage level carried by a capacitor. In such a system, the discrimination voltage threshold can be as small as hundreds of millivolts. Therefore, the accuracy of the voltage measurements can be very important.

It should be also noted, that for many practical applications what is really of interest is the input voltage at the gate of a transistor. To perform an accurate measurement of this voltage, the measuring equipment must have substantially high input impedance. Debugging of analog circuits also often requires precise measurement of dynamic electrical signals in a wide dynamic range.

Dynamic voltage measurement can be also used to characterize delay in a line of an integrated circuit. Specifically, a comparator can be utilized to perform signal discrimination using a predetermined voltage threshold value. In such a system, the timing characteristics of the binary output of the comparator can be used to study the parameters of the line delay. An exemplary embodiment of a system for measuring line delays in circuit is described in detail in Soumyanath, K., S. Borkar, et al., "Accurate On-Chip Interconnect Evaluation: A Time-Domain Technique." IEEE Journal of Solid-State Circuits 34(5): 623–631 (1999), incorporated herein by reference in its entirety. In this reference, the authors demonstrate that a comparator can be used to trigger an output signal in accordance with a reference voltage applied to the comparator. One disadvantage of this approach is that it requires coupling of the comparator to an external signal measurement circuitry through an external pin or probe pad, thus limiting its applicability to production devices, or at least which can be externally electrically coupled. Specifically, because the aforementioned technique requires coupling the measured signal out of the chip, the bandwidth of the measured signal is limited by the bandwidth of the packaging and the number of sites which can be measured is limited to the availability of external pads.

According to a traditional voltage signal measurement technique, the voltage measuring device is mechanically coupled to a point of the circuit of interest using a mechanical probe in such a way as to establish an electrical connection therewith. However, it is often not possible to measure the voltage directly using a mechanical probe because the line of interest is inaccessible. For example, the metal may be buried under other layers of metal, or it may be completely enclosed in the packaging, as is the case in flip-chip packaged parts.

Moreover, the existing measurement techniques utilizing mechanical contacts may adversely affect the operation of the integrated circuit by changing the impedances within the circuit or even causing an electrical short circuit during the measurement.

Additionally, in many packaged parts the metal pads may all be allocated to power, ground, and signal lines. In order to make internal measurements of a device it is necessary to make contact directly with a metal line, independent of the availability of a pad. However, many modern devices have six or more metal layers, making access to the lower metal layers nearly impossible. In addition, a growing number of modern devices are packaged in C4 or flip-chip packages in which the silicon substrate is exposed and the metal layers are buried, precluding direct mechanical contact to the metal lines without time-consuming and invasive drilling through the silicon to make contact with the underlying metal lines.

Additionally, mechanical probes produce capacitive loading of the circuit under test, thus affecting the timing and voltage accuracy of the measurements.

Finally, traditional mechanical probes used to couple the voltage measuring devices with the partially processed integrated circuits suffer from reliability problems caused by the probe needles scratching and damaging the contact pads as well as poor high frequency performance. Mechanical probes can also produce debris, which may result in contamination of the wafer. These traditional measurement acquisition methods are not suitable for high-frequency, high-bandwidth, non loading testing and diagnostics of integrated circuits required by the industry.

Accordingly, the existing techniques for measuring voltage characteristics of dynamic electrical signals within integrated circuits suffer from the aforementioned accessibility, reliability and bandwidth problems associated with the use of mechanical probes. What is needed is a technique for measuring voltage inside an integrated circuit without requiring a physical contact.

SUMMARY OF THE INVENTION

The present invention is directed to methods and systems that substantially obviate one or more of the above and other problems associated with the conventional metrology, analysis, and electrical test of advanced IC design and manufacturing. Consistent with exemplary embodiments of the present invention, there are provided inventive techniques for dynamic in-line diagnostics of integrated circuits.

In accordance with one aspect of the inventive technique there is provided a method for measuring characteristics of a voltage signal inside of an integrated circuit. The inventive method comprises disposing a signal analysis circuit within the integrated circuit; in such a manner that the measured voltage signal inside the integrated circuit causes a change in a condition of the aforementioned signal analysis circuit. The condition of the signal analysis circuit is subsequently detected and the characteristics of the voltage signal inside the integrated circuit are determined based on the detected condition.

According to a feature of the inventive technique, the condition of the signal analysis circuit may be additionally determined by a reference voltage applied to the signal analysis circuit.

According to another feature of the inventive technique, the condition of the signal analysis circuit may be detected by registering photon emission produced by the signal analysis circuit. In addition, the arrival time of the registered photon emissions may be also recorded.

According to yet another feature of the inventive technique, the signal analysis circuit may comprise a comparator. This comparator may change its state when the voltage signal reaches a reference voltage level.

According to yet another feature of the inventive technique, the signal analysis circuit may comprise at least one photon emitting structure. This structure may be an optically-exposed saturated nMOS or pMOS transistor or an optically-exposed CMOS device.

According to yet another feature of the inventive technique, a test signal may be injected into the integrated circuit.

In accordance with another aspect of the inventive technique, there is provided an apparatus for measuring characteristics of a voltage signal inside of an integrated circuit. The inventive apparatus comprises a signal analysis circuit disposed within the aforementioned integrated circuit such that the voltage signal inside the integrated circuit causes a change in a condition of the signal analysis circuit. The inventive apparatus further comprises a detector for detecting the condition of the signal analysis circuit in such a manner that the characteristics of the voltage signal inside the integrated circuit are determined based on the detected condition.

In accordance with yet another aspect of the inventive technique, there is provided an integrated circuit. The inventive circuit comprises a signal analysis circuit disposed within the integrated circuit. The aforementioned signal analysis circuit changes its condition based on a measured voltage signal applied thereto. The signal analysis circuit may further comprise a photon emitting structure for transmitting information on the condition of the aforementioned signal analysis circuit to external measuring equipment.

Additional aspects and features related to the invention will be set forth in part in the description which follows, and in part will be obvious from the description, or may be learned by practice of the invention. Aspects and features of the invention may be realized and attained by means of the elements and combinations particularly pointed out in the appended claims.

It is to be understood that both the foregoing and the following descriptions are exemplary and explanatory only and are not intended to limit the claimed invention in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawings, in which identical functional elements are designated with like numerals. The aforementioned accompanying drawings show by way of illustration, and not by way of limitation, specific implementations consistent with principles of the present invention. These implementations are described in sufficient detail to enable those skilled in the art to practice the invention and it is to be understood that other implementations may be utilized and that structural changes may be made without departing from the scope and spirit of present invention. The following detailed description is, therefore, not to be construed in a limited sense.

According to the inventive concept, a dynamic electric signal inside an integrated circuit under test is first applied to a signal analysis circuit provided within the tested integrated circuit. The aforementioned signal analysis circuit may change its condition or state depending on the characteristics of the electrical signal applied thereto. These changes in the condition of the signal analysis circuit may be registered or monitored by an external circuitry disposed outside the circuit under test. To this end, the signal analysis circuit may be optically coupled with the aforementioned external circuitry that would register specific changes in the condition of the signal analysis circuit caused by the aforementioned measured characteristics of the applied dynamic electrical signal. The information on the condition of the signal analysis circuit registered by the external circuitry can be used to measure the characteristics of the dynamic electrical signal within the circuit.

Figure 1:
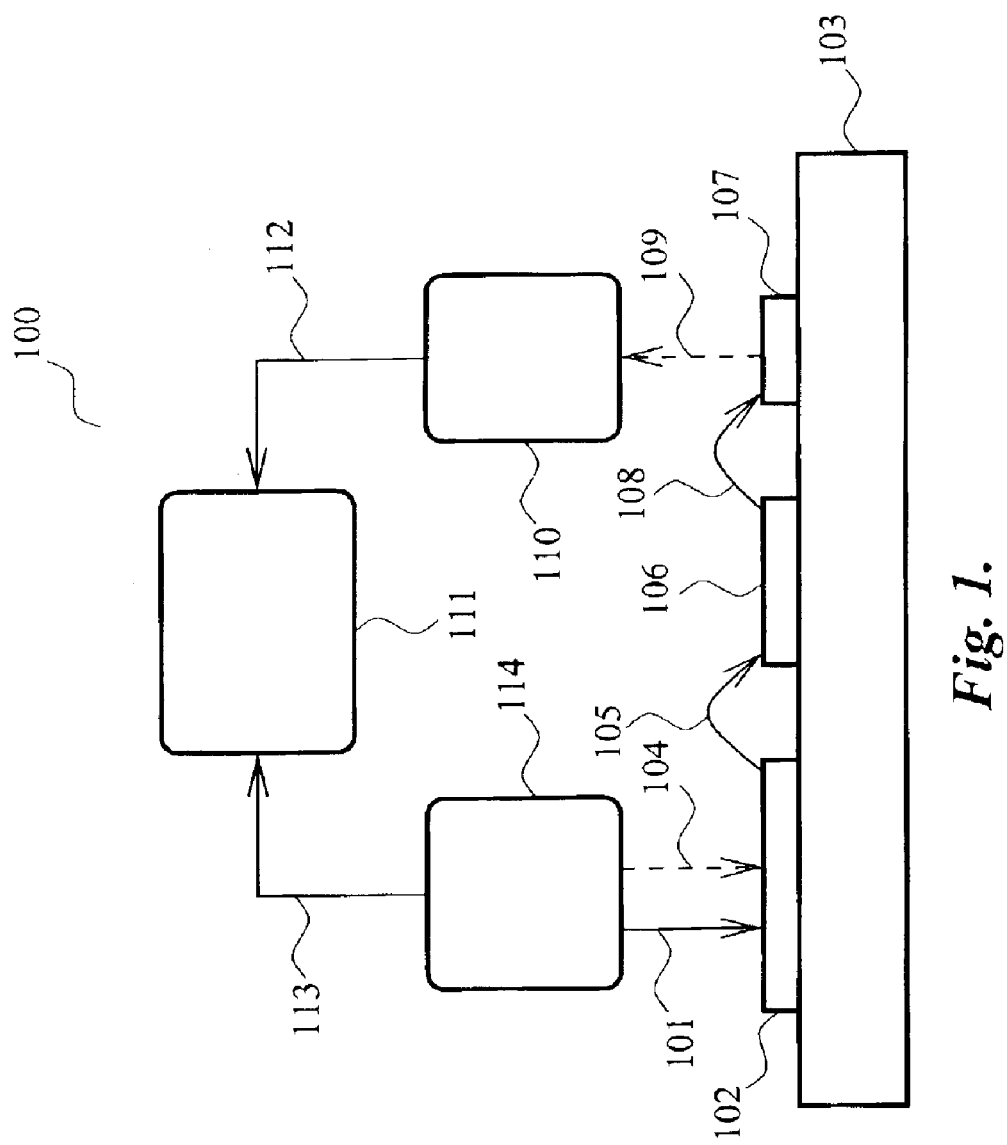
FIG. 1 illustrates an exemplary embodiment of a system utilizing light emission timing measurements.

FIG. 1 depicts an exemplary embodiment 100 of the inventive electrical signal analysis concept. An electrical test signal 101 is injected into a circuit under test 102 disposed on a wafer 103. Alternatively, the test signal may be optically injected into the circuit, as designated by numeral 104. The aforementioned injected test signals 101 or 104 cause a responsive dynamic electrical signal 105, which is applied to the signal analysis circuit 106 also disposed on the wafer 103. The signal analysis circuit 106 changes its condition or state depending on the characteristics of the electrical signal 105. The signal analysis circuit 106 is coupled with one or more light emitting structure 107, as referenced by numeral 108 in FIG. 1. On the other hand, the light emitting structure 107 generates an emission 109 indicative of the condition or state of the signal analysis circuit 106, said emission 109 being registered by an optical emission receiver 110, disposed outside the wafer 103. The information on the timing of the light emission 109 is supplied by the emission receiver 110 to a timing circuit 111. Said timing information is designated by numeral 112 in FIG. 1. The timing circuit 111 may also receive the timebase 113 from the test signal generator 114. As would be appreciated by those of skill in the art, the described system 100 may be used to study the characteristics of the dynamic electrical signal 105 and specifically the timing of changes in said characteristics relative to the timebase 113. It should also be noted that in an alternative embodiment of the inventive system, the light emitting structure 107 may be an integral part of the signal analysis circuit 106.

An embodiment of the system implementing the inventive technique for measuring characteristics of dynamic electrical voltage signals comprises a signal analysis circuit having an input receiving the voltage signal to be analyzed, an input receiving a reference voltage, and a means for emitting one or more photons (or providing for a non-zero, but less than one, probability of emitting a photon) when a specific voltage level is reached. This specific voltage level can be determined by a voltage signal applied to the aforementioned reference voltage input of the signal analysis circuit or by an internally-generated reference voltage.

Figure 2:
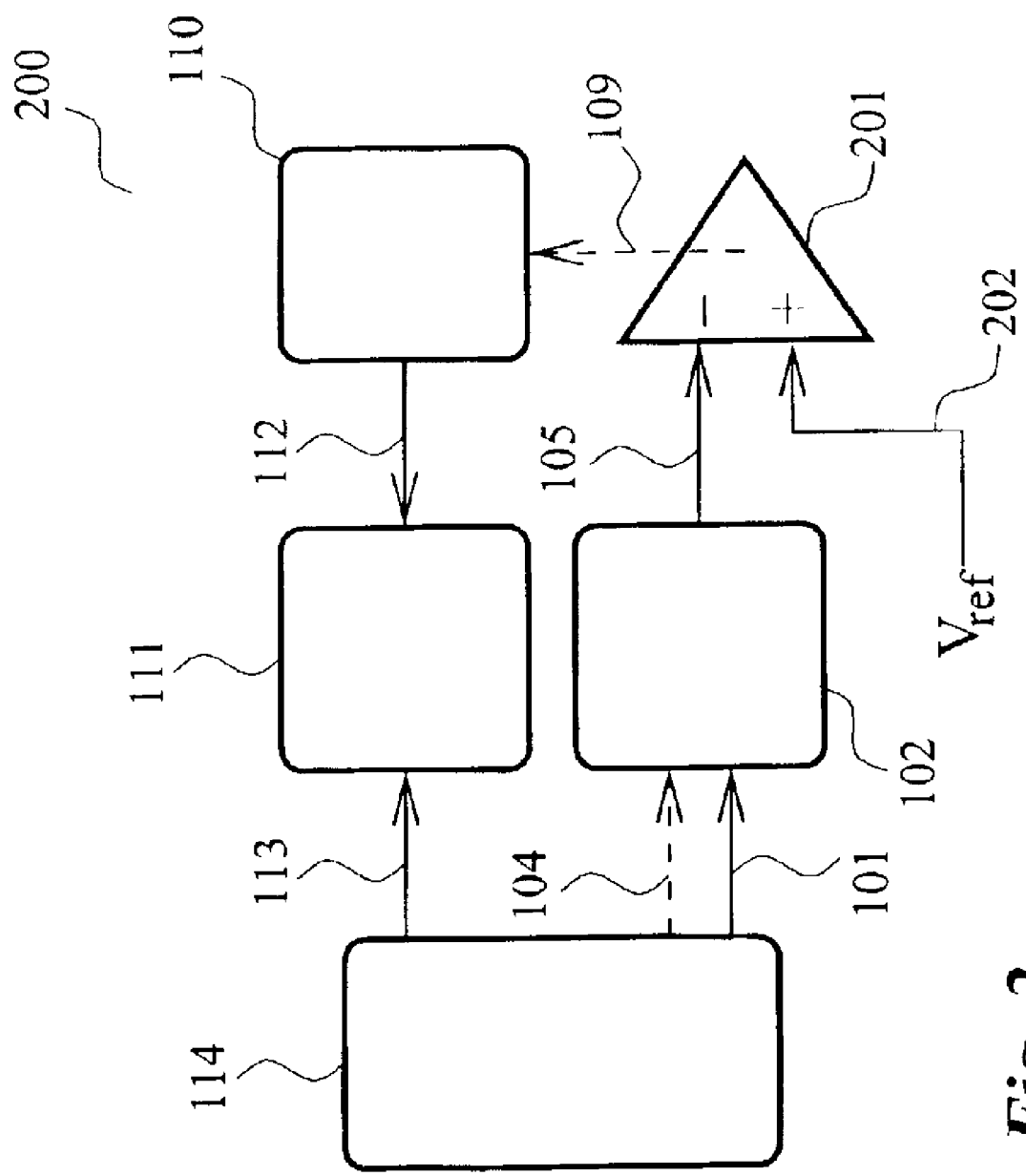
FIG. 2 depicts a schematic diagram of an inventive signal analysis system utilizing a comparator to measure voltage in a circuit.

One exemplary embodiment of the aforementioned signal analysis circuit 106 is a comparator. Designs and methods of operation of comparators are well known to persons of skill in the art. FIG. 2 depicts a schematic view of an embodiment of the inventive signal analysis system 200 using a comparator 201.

In the embodiment of the inventive system shown in FIG. 2, the measured dynamic electrical signal 105 is applied to the inverting input of the comparator 201. A constant reference voltage level 202 is applied to the non-inverting input. The comparator 201 changes its state when the amplitude of the signal at the inverting input reaches the corresponding amplitude at the non-inverting input. Such a change of state may produce the emission of one or more photons 109 which are registered by the external emission receiving circuit 110. The remaining functional elements of the system shown in FIG. 2 are identical to the similarly-numbered elements of the embodiment shown in FIG. 1.

It would be readily understood by those of skill in the art that the described comparator 201 may be integrated in the CMOS technology. One such comparator design is described in the aforementioned reference by Soumyanath, K., S. Borkar, et al., "Accurate On-Chip Interconnect Evaluation: A Time-Domain Technique." IEEE Journal of Solid-State Circuits 34(5): 623–631 (1999), which is incorporated herein by reference in its entirety.

Figure 3:
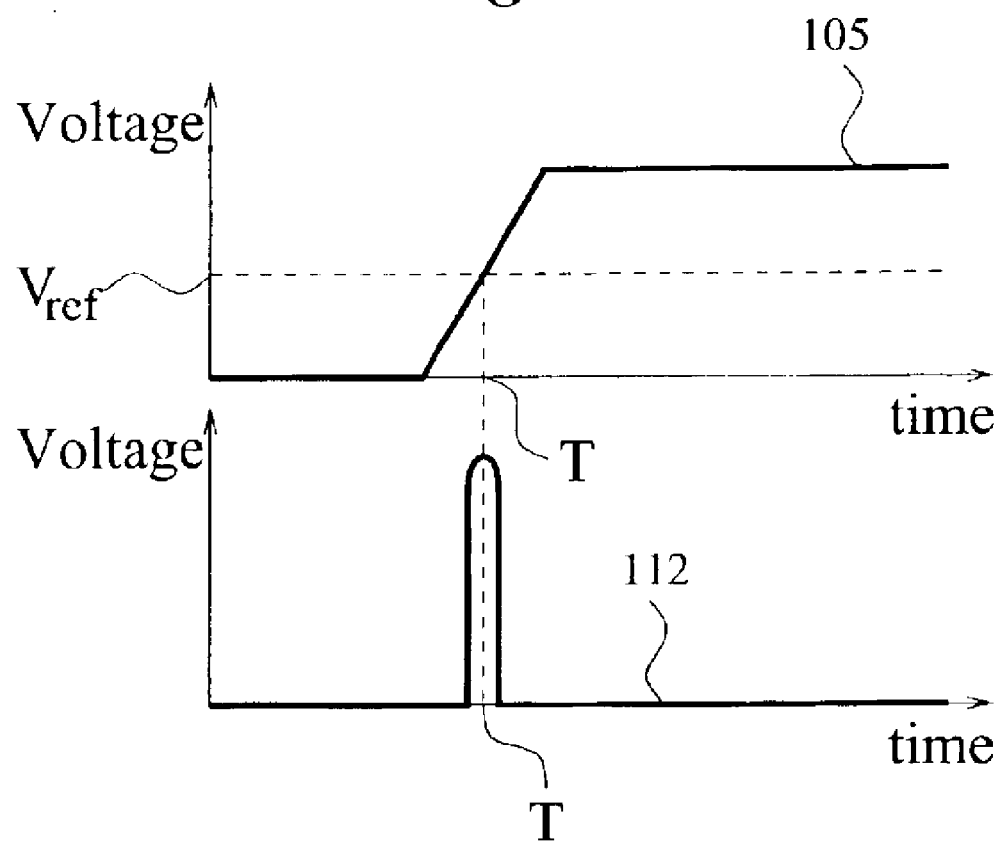
FIG. 3 depicts diagrams further illustrating operation of the inventive signal analysis system utilizing a comparator.

FIG. 3 further illustrates the operation of the described embodiment of the inventive system. Specifically, the comparator 201 shown in FIG. 2 compares the electrical signal 105 with the reference voltage level Vref. When, at the time T, the signal 105 reaches the level of Vref, the comparator 201 switches its state, causing the emission 109, which is registered by the emission detector 110. The signal 112 depicted in FIG. 3 carries the information on the timing T of the aforementioned event.

It should be also noted that the test signals 101 or 104 may be made periodic in time and the aforementioned measurement may be repeated for different values of the reference voltage Vref. In each measurement, the aforementioned optical emission detection apparatus 110 may measure the timing of the optical emission signal 109 in relationship to the timing of the test signals 101 or 104 applied to the integrated circuit under test 102. The so obtained timing information on the photon emissions from the comparator 201 corresponding to different values of the reference voltage 202 may be used to reconstruct the shape of the dynamic electric signal 105 in the integrated circuit 102.

It would be understood by those of skill in the art that a variety or light emission sources within the integrated circuit may be utilized to register the change in the state or condition of the signal analysis circuit 106. The suitable photon emission mechanisms include, without limitation: (1) emissions form gate oxide leakage between transistor gate and either the substrate or the diffusion area; (2) emissions from forward biased p-n junctions; (3) emissions from MOS transistors in the state of saturation during normal switching operation; (4) emissions from MOS transistors in the state of saturation caused by an open circuit; (5) emissions from tunneling in a reverse-biased junction; and (6) emissions from electron-hole recombination. It would be readily appreciated by skilled in the art that the exact nature of the utilized photon emission mechanism is not essential to the novel concept of the present invention.

In an embodiment of the inventive technique, the photon emission from, for example, a transistor in the signal analysis circuit may be collected using an optical signal detection apparatus described in U.S. Pat. No. 6,859,031. Specifically, a dynamic or time-resolved emission can be used to measure the presence of hot electrons in nMOS or pMOS circuits. It is well known in the art that such a flow of hot electrons is coincident with a transition in a transistor. The detected time-resolved emission can thus be used to measure transitions in a signal analysis device 106.

The U.S. Pat. No. 5,940,545, incorporated herein by reference in its entirety, describes the basic concepts of time resolve emission which can be used in implementing the novel technique of the present invention. Specifically, an intrinsic, transient optical emission from a CMOS integrated circuit described in the aforementioned patent can be used to obtain information on the characteristics of the measured electrical signal. To this end, the CMOS circuit can be optically coupled to, for example, an avalanche photon detector (APD) connected to a time-to-amplitude converter so as to perform time-resolved measurements of the transitions in the CMOS-based signal analysis circuit. As disclosed in the patent, depending on type of the emission detector used, the resolution of the time measurements can be better than 100 ps.

The time-resolved emission measurement methodology utilized in another embodiment of the inventive system may be similar to the non-invasive time-resolved measurement technique based on detecting of the infra-red radiation emitted by hot electrons, which is described in detail in Rusu et al., "Backside Infrared Probing for Static Voltage Drop and Dynamic Timing Measurements", In Proceedings of the 2001 IEEE International Solid-State Circuits Conference (2001), incorporated herein by reference. In the aforementioned reference, mercury cadmium telluride detector array having a good sensitivity in the wavelength range of 0.9–1.45 micron was used to successfully perform measurements of light emissions from switching transistors. The emission intensity has been shown to closely match the simulated current through the gate of a transistor. One disadvantage of the technique described in Rusu et al. is that the saturated transistor used to provide the optical coupling with the external measurement acquisition electronics may significantly load the line. Specifically, the loading impedance of the saturated transistor may be as low as 25K Ohm. In addition the mercury cadmium telluride detector used did not have time resolution, although the use of a suitable time-resolved detector would have overcome this limitation.

Figure 4:
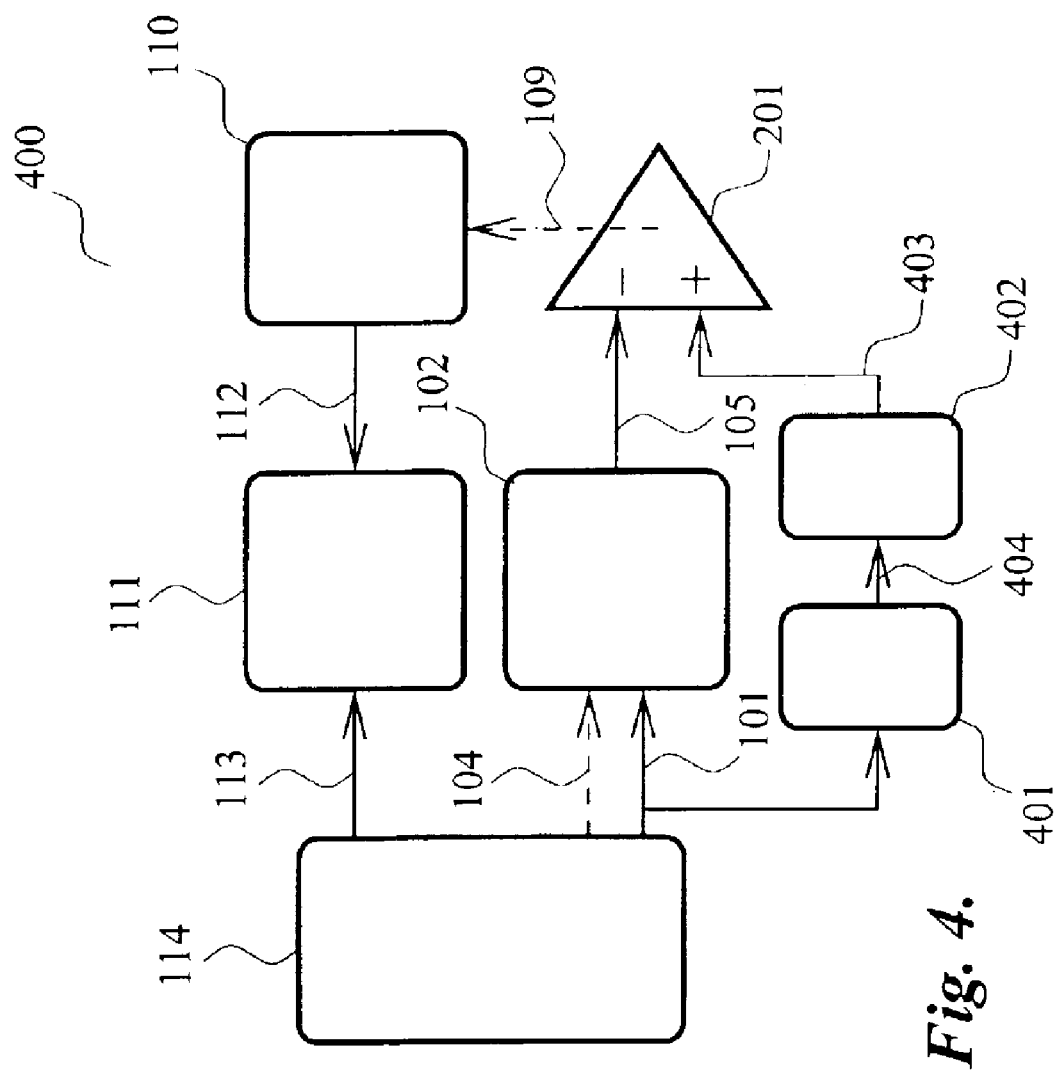
FIG. 4 depicts a schematic diagram of an inventive signal analysis system utilizing a counter and a digital-to-analog converter to generate a set of reference voltage levels.

In an alternative embodiment 400 of the inventive technique shown in FIG. 4, a counter 401 coupled with a digital-to-analog converter 402 is used to generate a stepped set of reference voltages 403 to be applied to the inverting input of the comparator 201. The counter 401 can be clocked synchronously with respect to the test circuit 102 in such a manner that in each subsequent circuit test cycle the reference voltage 403 is changed by a predetermined amount. The test cycle is some multiple of the clock cycle. Specifically, each subsequent circuit test cycle would increase the value in the counter 401 by one unit, which, in turn, would cause a unit increment in the output voltage generated by the digital-to-analog converter 402 coupled with the counter 401. In FIG. 4, the numeral 404 designates the binary output of the counter 401.

Figure 5:
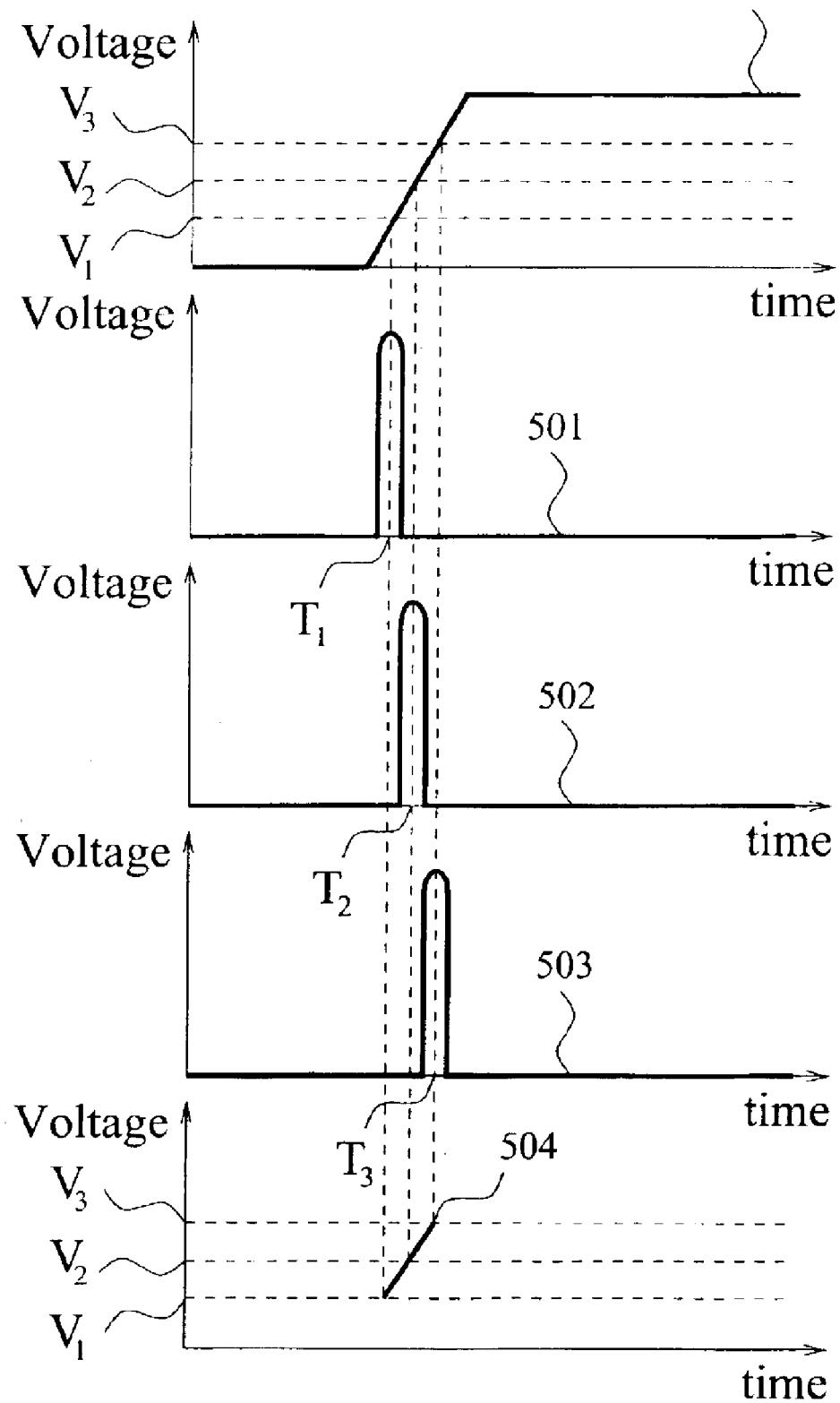
FIG. 5 depicts diagrams further illustrating operation of the inventive signal analysis system utilizing a counter and a digital-to-analog converter.

The relative timing of the optical emission 109 from the signal analysis circuit with respect to the timing of the circuit clock signal can be registered by the emission detector 110 for each test cycle and for each value of the reference voltage 403. The timing measurements corresponding to each incremental value of the reference voltage 403 can be combined in such a way as to reconstruct the waveform of the electrical signal in the integrated circuit, as illustrated in FIG. 5. To this end, the time-voltage value pairs (V1, T1), (V2, T2) and (V3, T3) corresponding to each of the timing measurements can be placed on an orthogonal time-voltage coordinate system as depicted in FIG. 5. Numerals 501, 502 and 503 designate the signals produced by the light emission detection device 110 during three sequential circuit test cycles. As it will become apparent, these three timing signals carry the information on the characteristics of the dynamic electrical signal 105. The points defined by the aforementioned time-voltage pairs (V1, T1), (V2, T2) and (V3, T3) can be connected as to reconstruct the waveform 504 of the electrical signal 105. It would be undoubtedly appreciated by those of skill in the art that the described method is especially suitable for reconstruction of the waveform of a periodic electrical signal within the integrated circuit.

To perform the electrical signal measurements for a specific chip design in accordance with an embodiment of the inventive technique described herein, one may first determine during the chip design which circuits on the chip are of critical importance. The user may then incorporate a set of voltage-dependent emitter circuits, which are to be used to perform the signal measurements, into the chip layout. Once the chip is produced, it is placed in a machine which can perform the stimulation of the chip operation and collect the photons emitted by the chip. For each predetermined reference voltage applied to the device the emitted photons are collected in a time-resolved manner. The voltage on the non-inverting input of the aforementioned comparator circuit is adjusted to a new voltage level during each subsequent test cycle and the emission is again detected in a time-resolved manner. A set of measured timing parameters of the optical emissions obtained at different reference voltage settings in the aforementioned manner are used to reconstruct the waveform of the dynamic electrical signal within the circuit.

In an exemplary embodiment of the inventive system, the target voltage measurement resolution is 50 millivolts. As it would be undoubtedly appreciated by those of skill in the art, the target voltage measurement accuracy is less important, but it may be as low as 10% or lower.

It would be undoubtedly appreciated by those of skill in the art that various known techniques can be used for applying an electrical or optical test signals to the circuit under test. The exact nature of these techniques is not essential to the novel concept of the present invention. For example, the test signals may be optically injected into the circuit under test using an optical signal source, such as a laser, optically coupled with light receiving structures disposed on the wafer. Alternatively, the test signals may be applied to the circuit under test using conventional mechanical probes. Techniques for applying various test signals to integrated circuits are described, for example, in U.S. Pat. No. 6,859,031, the entire disclosure of which is incorporated herein by reference.

The electrical test signal applied to the circuit would induce a dynamic electrical activity therein. Once the aforementioned dynamic electrical signals have been so induced, the inventive technique for measuring voltage characteristics of dynamic electrical signals in integrated circuits described herein can be used for studying the performance of the integrated circuit under test and determining whether it performs in accordance with the appropriate design specifications.

It should be also noted that any special structures that may be used in the integrated circuit testing process may be disposed in the areas of the wafer that would be severed from the tested integrated circuit in a subsequent sawing or dicing operation. Specifically, the entire signal analysis circuit or the aforementioned light emitting structures may be located, for example, in the inter-dye parts of the wafer that would be eliminated at the sawing stage of the integrated circuit fabrication process.

It will also become apparent to those of skill in the art, that the inventive technique for measuring voltage characteristics of dynamic electrical signals in integrated circuits may be used to test integrated circuits at various stages of the fabrication process. Specifically, partially processed semiconductor wafers may be diagnostically tested according to the principles described herein after being subjected to any appropriate step of the integrated circuit production cycle. Moreover, the testing of the functionally complete integrated circuit may be performed before and even after the packaging.

It should be noted that the inventive technique is compatible with both front-side and backside (through-silicon) device analysis. Specifically, the aforementioned optical emission detector may be positioned to face either the front or the back surface of the circuit. In the latter case, the optical emissions of the circuit would have to pass through the material (e.g. silicon) of the wafer before being registered by the emission detector, and the absorption spectrum of the wafer material needs to be considered in choosing the spectral sensitivity parameters of the optical emission detector.

Moreover, the inventive measurement technique is not inherently limited to measuring only voltage characteristics of electrical signals in integrated circuits. The inventive methodology of using a specialized signal analysis circuit within the integrated circuit under test can be applied to measuring other signal characteristics, such as electrical current, frequency, noise level, etc. To this end, the aforementioned signal analysis circuit may be designed to respond to changes in the appropriate signal parameter. In an alternative embodiment of the invention, the signal analysis circuit may be designed or configured to sense the change in the frequency of the electrical signal. An exemplary embodiment of such a frequency-sensing signal analysis circuit would be a digital counter. In yet another embodiment of the inventive technique, the signal analysis circuit may be configured to sense the change in the current or noise level of the electrical signal.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention.

Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for measuring characteristics of an electrical signal inside of an integrated circuit, said method comprising: disposing a signal analysis circuit within said integrated circuit; wherein said electrical signal inside said integrated circuit causes a change in a condition of said signal analysis circuit; detecting said condition of said signal analysis circuit in a wireless manner; and determining said characteristics of said electrical signal inside said integrated circuit based on said detected condition, wherein said detecting of said condition of said signal analysis circuit comprises recording an arrival time of photon emissions produced by said signal analysis circuit.

2. The method of claim 1, wherein said condition of said signal analysis circuit is additionally determined by a reference voltage applied to said signal analysis circuit.

3. The apparatus of claim 1, wherein said electrical signal is a noise signal.

4. The apparatus of claim 1, wherein said electrical signal is a frequency signal.

5. The method of claim 1, wherein said electrical signal is a voltage signal and said signal analysis circuit comprises a comparator.

6. The method of claim 5, wherein a reference voltage level is applied to said comparator; said comparator changing its state when said electrical signal reached said reference voltage level.

7. The method of claim 6, wherein said detecting further comprises: (1) recording an arrival time of photons emissions produced by said comparator; (2) adjusting said applied reference voltage level; and (3) repeating (1) and (2) for at least two test cycles of said integrated circuit.

8. The method of claim 7, further comprising using said recorded photon arrival times and corresponding values of said applied reference voltage to reconstruct said characteristics of said electrical signal.

9. The method of claim 7, wherein said reference voltage level is produced by a digital-to-analog converter coupled to a digital counter.

10. The method of claim 9, further comprising using a test cycle of said integrated circuit to increment said digital counter.

11. The method of claim 1, wherein said signal analysis circuit comprises at least one photon emitting structure.

12. The method of claim 11, wherein said at least one photon emitting structure comprises an optically-exposed saturated nMOS or pMOS transistor.

13. The method of claim 11, wherein said at least one photon emitting structure comprises an optically-exposed CMOS device.

14. The method of claim 1, further comprising injecting a test signal into said integrated circuit.

15. The method of claim 1, wherein said detecting of said condition of said signal analysis circuit is performed through a front surface of said integrated circuit.

16. The method of claim 1, wherein said detecting of said condition of said signal analysis circuit is performed through a back surface of said integrated circuit.

17. An apparatus for measuring characteristics of an electrical signal inside of an integrated circuit, said apparatus comprising: a signal analysis circuit disposed within said integrated circuit; wherein said electrical signal inside said integrated circuit causes a change in a condition of said signal analysis circuit; and a detector for detecting said condition of said signal analysis circuit in a wireless manner; wherein said characteristics of said electrical signal inside said integrated circuit are determined based on said detected condition, and wherein said detector records an arrival time of photon emissions produced by said signal analysis circuit.

18. The apparatus of claim 17, wherein said condition of said signal analysis circuit is additionally determined by a reference voltage applied to said signal analysis circuit.

19. The apparatus of claim 17, wherein said electrical signal is a noise signal.

20. The apparatus of claim 17, wherein said electrical signal is a frequency signal.

21. The apparatus of claim 17, wherein said electrical signal is a voltage signal and wherein signal analysis circuit comprises a comparator.

22. The apparatus of claim 21, wherein a reference voltage level is applied to said comparator; said comparator changing its state when said voltage signal reached said reference voltage level.

23. The apparatus of claim 22, further comprising: a timing circuitry for recording an arrival time of photons emissions produced by said comparator; a voltage adjusting device for adjusting said applied reference voltage level; and a clock signal generator for generating test cycles for said integrated circuit, wherein said timing circuitry records said arrival times and said voltage adjusting device adjusts said applied voltage level for at least two test cycles generated by said clock cycle generator.

24. The apparatus of claim 23, wherein said recorded photon arrival times and corresponding values of said applied reference voltage are used to reconstruct said characteristics of said electrical signal.

25. The apparatus of claim 24, wherein said digital counter is incremented using said clock cycles generated by said clock signal generator.

26. The apparatus of claim 23, wherein said voltage adjusting device comprises a digital-to-analog converter coupled to a digital counter.

27. The apparatus of claim 17, wherein said signal analysis circuit comprises at least one photon emitting structure.

28. The apparatus of claim 27, wherein said at least one photon emitting structure comprises an optically-exposed saturated nMOS or pMOS transistor.

29. The apparatus of claim 27, wherein said at least one photon emitting structure comprises an optically-exposed CMOS device.

30. The apparatus of claim 17, further comprising a device for injecting a test signal into said integrated circuit.

31. The apparatus of claim 17, wherein said detector is disposed in a predetermined relation with respect to said integrated circuit to perform said detecting of said condition through a front surface of said integrated circuit.

32. The apparatus of claim 17, wherein said detector is disposed in a predetermined relation with respect to said integrated circuit to perform said detecting of said condition through a back surface of said integrated circuit.

33. An integrated circuit comprising a signal analysis circuit disposed within said integrated circuit; said signal analysis circuit changing its condition based on a measured electrical signal applied to said signal analysis circuit; wherein said signal analysis circuit comprises a photon emitting structure for transmitting information on said condition of said signal analysis circuit to an external measuring equipment, and wherein said external measuring equipment records an arrival time of photon emissions produced by said photon emitting structure.

34. The integrated circuit of claim 33, wherein said condition of said signal analysis circuit is additionally determined by a reference voltage applied to said signal analysis circuit.

35. The integrated circuit of claim 33, wherein said electrical signal is a voltage signal and wherein said signal analysis circuit comprises a comparator.

36. The integrated circuit of claim 35, wherein a reference voltage level is applied to said comparator; said comparator changing its state when said voltage signal reaches said reference voltage level.

37. The integrated circuit of claim 33, wherein said at least one photon emitting structure comprises an optically-exposed saturated nMOS transistor.

38. The integrated circuit of claim 33, wherein said at least one photon emitting structure comprises an optically-exposed CMOS device.

* * * * *